United States Patent [19]

Fujiwara

[11] Patent Number: 4,754,235

[45] Date of Patent: Jun. 28, 1988

[54] FREQUENCY SYNTHESIZER WITH LOW POWER CONSUMPTION

[75] Inventor: Yukinari Fujiwara, Kodaira, Japan

[73] Assignee: Hitachi Denshi Kabushiki Kaisha, Tokyo, Japan

[21] Appl. No.: 19,025

[22] Filed: Feb. 26, 1987

[30] Foreign Application Priority Data

Mar. 3, 1986 [JP] Japan .................................. 61-44183

[51] Int. Cl.⁴ .............................................. H03L 7/06
[52] U.S. Cl. .................................... 331/1 A; 331/14; 331/17; 331/25
[58] Field of Search ...................... 331/1 A, 14, 17, 18, 331/25

[56] References Cited

U.S. PATENT DOCUMENTS 4,625,180  11/1986  Itaya et al. ......................... 331/14 X
4,673,892   6/1987  Miyashita et al. ..................... 331/14

Primary Examiner—Eugene R. LaRoche
Assistant Examiner—David Mis
Attorney, Agent, or Firm—Charles E. Pfund

[57] ABSTRACT

A synthesizer apparatus includes a reference oscillator for generating a reference signal, a voltage controlled oscillator (VCO) whose oscillation frequency is controlled by a control signal, a frequency divider, which is intermittently operated, for frequency-dividing the output signal from the VCO, and a phase comparator for comparing the phases of the reference signal and the output signal from the frequency divider, and supplying a control signal to the VCO in accordance with the phase difference. The phase comparator outputs an average value signal having an average value corresponding to a difference in pulse rise times of the output signal from the frequency divider during an operation period of the frequency divider.

3 Claims, 7 Drawing Sheets

FREQUENCY SYNTHESIZER WITH LOW POWER CONSUMPTION

BACKGROUND OF THE INVENTION

The present invention relates to a synthesizer apparatus for generating a signal of an arbitrary frequency and, more particularly, to a synthesizer apparatus which can save power consumption.

A synthesizer apparatus is normally used in an oscillator of a tranceiver for performing multi-frequency radio communication. When such a tranceiver is used in a mobile radio communication service, the mobile supplies power. Therefore, the synthesizer apparatus used therefor must be of a low power consumption type.

FIG. 1 is a block diagram showing a conventional synthesizer apparatus taking a low power consumption requirement into consideration. FIGS. 2(a) to 2(g) are respectively waveforms of signals denoted by a to g in FIG. 1. A signal produced by a reference oscillator 1 is frequency-divided by a frequency divider 2, and is output as a signal a shown in FIG. 2(a). This signal is counted by a counter 6, and the counter 6 supplies a pulse signal b having a period three times an input pulse period to a set terminal S of an R-S flip-flop (to be referred to as an FF hereinafter) 9. As a result, the FF 9 is reset, and outputs a High level ("H") signal to a power supply 10. When the power supply 10 receives the "H" signal, it enables a frequency divider 8 for a predetermined period of time T, as shown in FIG. 2(g).

A voltage controlled oscillator (to be referred to as a VCO hereinafter) 5 continuously outputs a signal c shown in FIG. 2(c) to the frequency divider 8, and the frequency divider 8 frequency-divides the input signal only in the time T. A frequency-dividing constant of the frequency divider 8 is set to be 5. After a time T1 corresponding to a settling time of the frequency divider 8 has passed from the leading edge of the output signal b from the counter 6, the frequency divider 8 outputs, to a phase comparator 3, a signal d which goes to "H" in synchronism with the leading edge of the signal c supplied from the VCO 5.

A counter 7 receives the output signal a from the frequency divider 2, and produces a carry out signal e which goes to "H" in response to the leading edge of the (3n-1) pulse (n is a positive integer) of the signal a. The counter 7 supplies the signal e to the phase comparator 3. When the phase comparator 3 receives the "H" carry out signal from the counter 7, it detects a phase difference between the signal a supplied from the frequency divider 2 and the signal b supplied from the frequency divider 8, and outputs a signal f shown in FIG. 2(f). Since the signal f is supplied to the VCO 5 through a loop filter 4, the VCO 5 generates the signal c having a frequency for canceling the received signal to zero. Note that the carry out signal e is supplied to a reset terminal R of the FF 9 through an inverter 11.

In the circuit shown in FIG. 1, the frequency divider 8 must perform a high-speed operation, and consumes large power. However, if the frequency divider 8 is intermittently operated in response to a signal g as needed, low power consumption can be attained.

However, when the output frequency of the VCO 5 increases, and a time corresponding to one period is on the order equal to the settling time of the frequency divider 8, the frequency divider 8 often sends its output to be delayed by one period of the output frequency of the VCO 5 from the leading edge of the signal b in accordance with the rising condition of the power supply 10 and the rising temperature characteristic of the frequency divider 8, as indicated by symbol A in FIG. 2. For this reason, even if output signal intervals T2 of the frequency divider 8 are equal to each other, the output signals f from the phase comparator 3 have difference pulse widths, as shown in FIG. 2, and this interferes with synchronization of the VCO 5.

SUMMARY OF THE INVENTION

It is an object of the present invention to provide a synthesizer apparatus which is free from the conventional problems even when an output frequency of a VCO is on the order equal to the rise time of a frequency divider.

According to the present invention, there is provided a synthesizer apparatus comprising: means for generating a reference signal; voltage controlled oscillator means whose oscillation frequency is controlled by a control signal; frequency divider means which is intermittently operated and frequency divides an output signal of the voltage controlled oscillator means; and phase comparator means for comparing phases of the reference signal and the output signal from the frequency divider means, wherein the phase comparator means outputs, to the voltage controlled oscillator means, a control signal having an average value corresponding to a rise time difference of the frequency divider means during the operation period of the frequency divider means.

DETAILED DESCRIPTION OF THE PREFERRED EMBODIMENT

Figure 1:
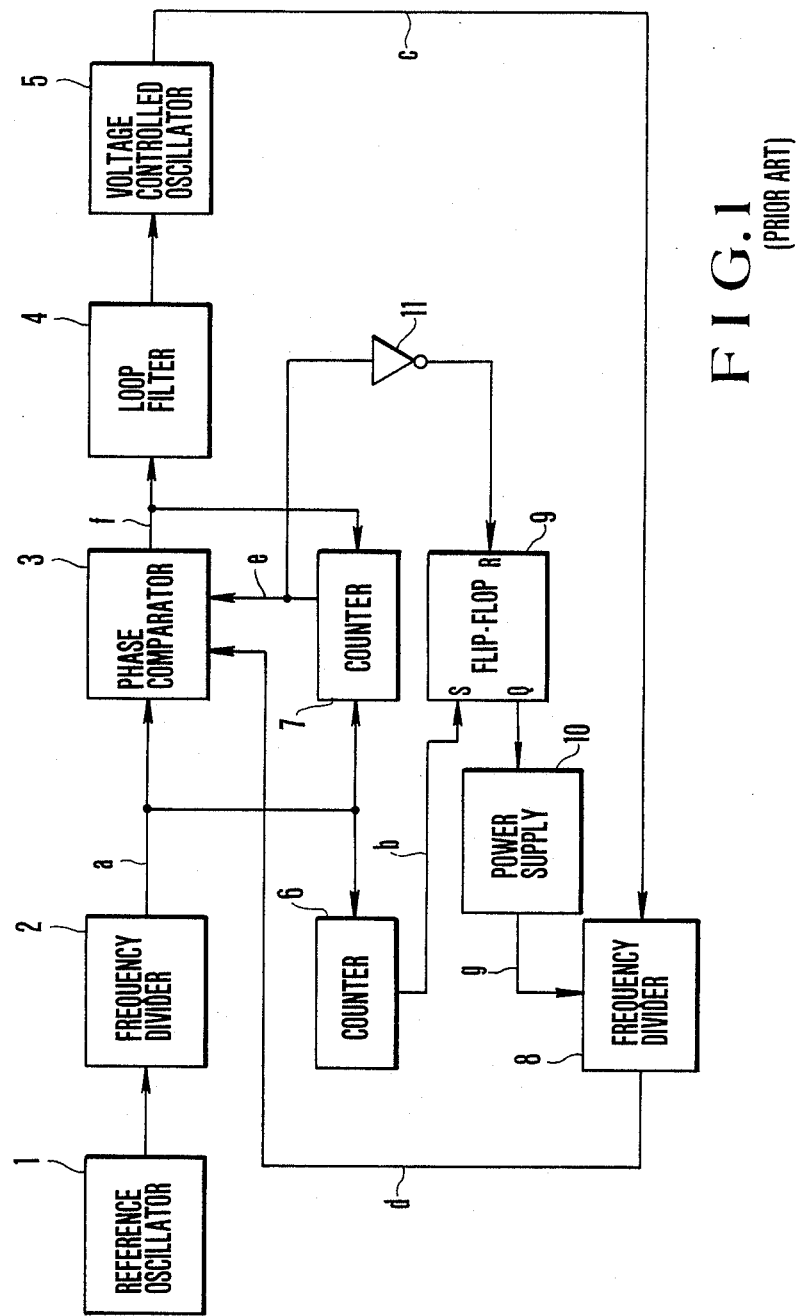
FIG. 1 is a block diagram showing a conventional synthesizer apparatus.
Figure 2:
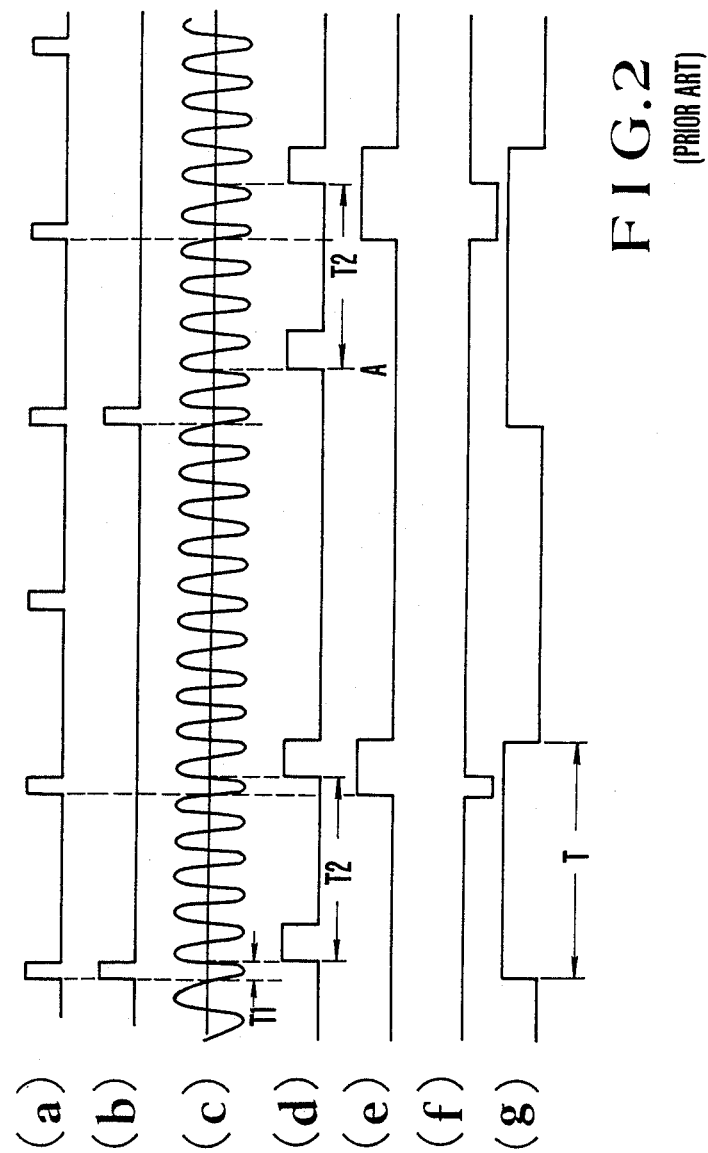
FIG. 2 is a timing chart showing the signal waveforms in the respective portion of FIG. 1.
Figure 3:
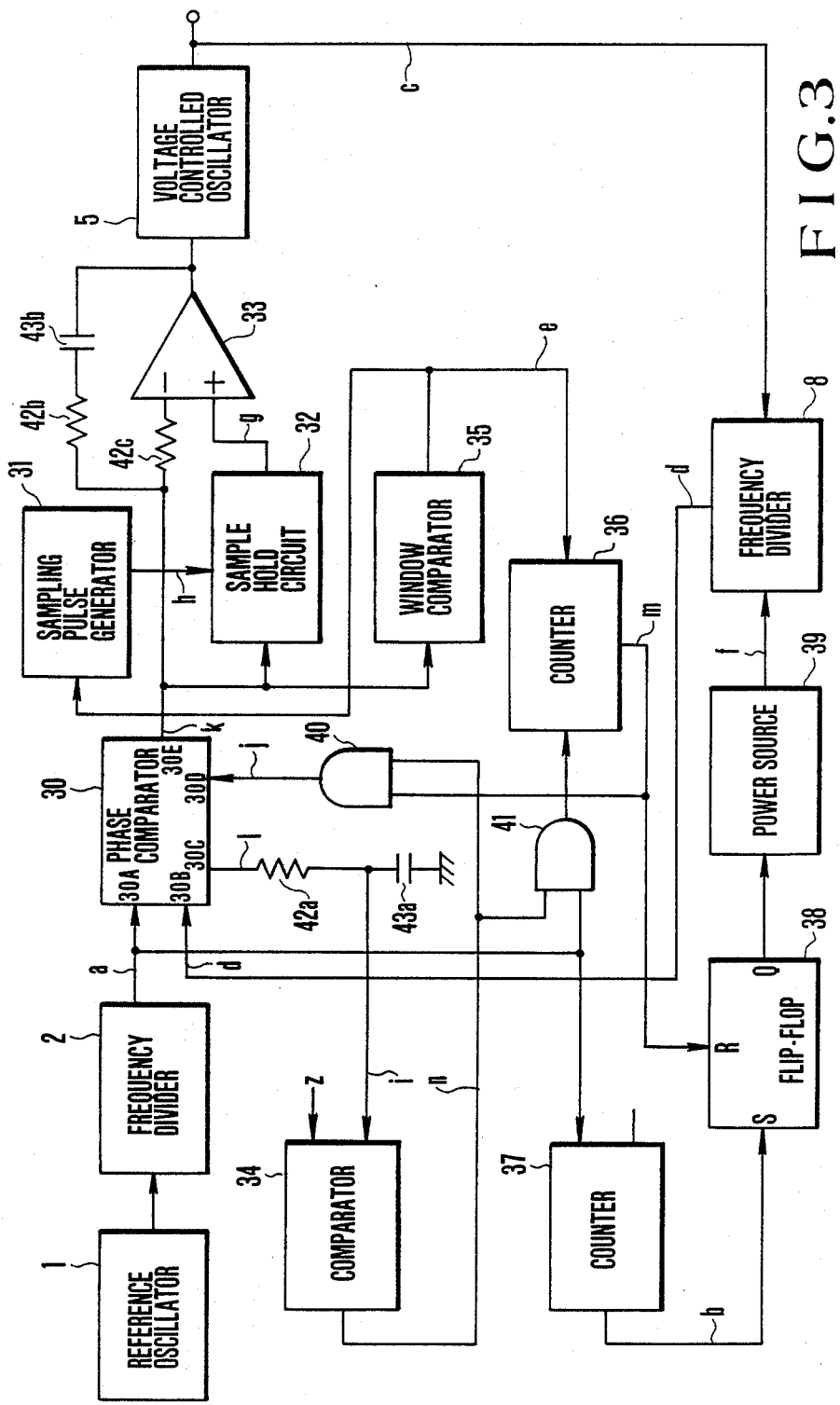
FIG. 3 is a block diagram of a synthesizer apparatus according to an embodiment of the present invention.

An embodiment of the present invention will now be described with reference to the accompanying drawings. FIG. 3 is a block diagram showing an embodiment of the present invention. The same reference numerals in FIG. 3 denote the same parts as in FIG. 1.

Figure 4:
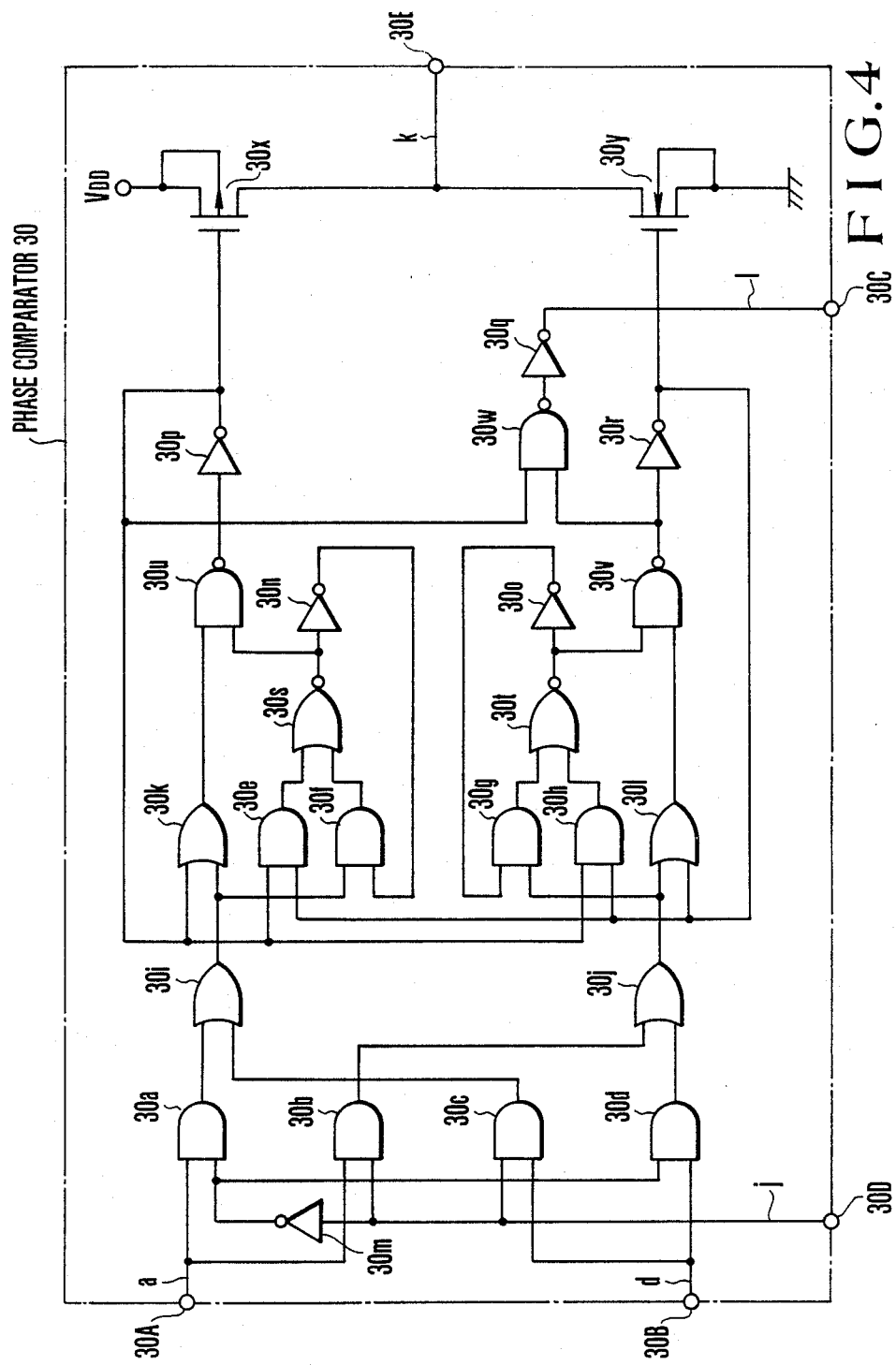
FIG. 4 is a circuit diagram showing an embodiment of a phase comparator shown in FIG. 3.

Referring to FIG. 3, the output from a reference oscillator 1 is supplied to a frequency divider 2, and an output a from the frequency divider 2 is supplied to an input terminal 30A of a phase comparator 30, a counter 37, and one input terminal of an AND gate 41. FIG. 4 is a detailed circuit diagram of the phase comparator 30 and will be described later. An output k from a terminal 30E of the phase comparator is supplied to the inverting input terminal (−) of an amplifier 33 through a resistor 42C, and is also supplied to a sample-hold circuit 32 and a window comparator 35. An output g from the sample-hold circuit 32 is applied to the noninverting input terminal (+) of the amplifier 33. An output e from the window comparator 35 is supplied to a sampling pulse generator 31 and a counter 36. The sampling pulse generator 31 supplies a sampling signal h to the sample-hold circuit 32. The output from the amplifier 33 is supplied to a VCO 5, and an output c from the VCO 5 is supplied to a frequency divider 8.

An output b from the counter 37 is supplied to a set terminal S of an FF 38, and a reset terminal R of the FF 38 receives an output m from the counter 36. A Q output terminal of the FF 38 sends a control signal to a power source 39. An output f from the power source 39 is supplied to the frequency divider 8. An output d from the frequency divider 8 is supplied to an input terminal 30B of the phase comparator 30.

The phase comparator 30 sends an output l from its output terminal 30C. The output terminal 30C is grounded through an integrating circuit comprising a series circuit of a resistor 42a and a capacitor 43a. The node between the resistor 42a and the capacitor 43a supplies a signal i obtained by integrating the output l to one input terminal of the comparator 34. The comparator 34 compares the input i with a predetermined synchronous range setting voltage Z. When the signal i is smaller than the voltage Z, the comparator 34 supplies an "L" (zero volt) signal n to the other input terminal of the AND gate 41 and one input terminal of an AND gate 40. On the other hand, when the signal i is larger, the comparator 34 supplies an "H" signal n to them. The output from the AND gate 41 is supplied to the counter 36. The other input terminal of the AND gate 40 receives the output m from the counter 36.

An output j from the AND gate 40 is supplied to an input terminal 30D of the phase comparator 30.

In the phase comparator 30 shown in FIG. 4, the input terminal 30A is connected to one input terminal of each of AND gates 30a and 30b. The input terminal 30B is connected to one input terminal of each of AND gates 30c and 30d. The input terminal 30D is connected to the other input terminal of each of AND gates 30b and 30c, and is connected to the other input terminal of the AND gate 30a through an inverter 30m. The other input terminal of the AND gate 30a is connected to the other input terminal of the AND gate 30d.

The output terminals of the AND gates 30a and 30c are connected to the input terminals of an OR gate 30i, and the output terminals of the AND gates 30b and 30d are connected to the input terminals of an OR gate 30j. With these circuits, the paths of the input signals a and d are switched between the OR gates 30i and 30j in accordance with the level of the signal j input from the input terminal 30D. The output terminal of the OR gate 30i is connected to one input terminal of each of an OR gate 30k and an AND gate 30f. The output terminal of the OR gate 30j is connected to one input terminal of each of an OR gate 30l and an AND gate 30g. The other input terminal of the OR gate 30k is connected to one input terminal of each of AND gates 30e and 30h and a NAND gate 30w, and to the output terminal of an inverter 30p. The other input terminals of the AND gates 30l, 30e, and 30h are connected to the output terminal of an inverter 30r. The other input terminals of the AND gates 30f and 30g are connected to the output terminals of inverters 30n and 30o, respectively. The output terminals of the AND gates 30e and 30f are connected to the input terminals of a NOR gate 30s, and the output terminal of the NOR gate 30s is connected to the input terminal of the inverter 30n and one input terminal of a NAND gate 30u. The other input terminal and the output terminal of the NAND gate 30u are connected to the output terminal of the OR gate 30k and the input terminal of the inverter 30p, respectively.

Contrary to the above circuit, the output terminals of the AND gates 30g and 30h are connected to the input terminals of a NOR gate 30t. The output terminal of the NOR gate 30t is connected to the input terminal of the inverter 30o and one input terminal of a NAND gate 30v. The other input terminal and the output terminal of the NAND gate 30v are connected to the output terminal of the OR gate 30l and the input terminal of the NAND gate 30w and the inverter 30r, respectively. The output terminal of the NAND gate 30w is connected to the output terminal 30C of the phase comparator 30 through an inverter 30q.

The output terminals of the inverter 30p and 30r are connected to the gate electrodes of transistors 30x and 30y which are respectively connected between a power source VDD and the output terminal 30E of the phase comparator 30 and between the output terminal 30E and the ground potential.

Figure 6:
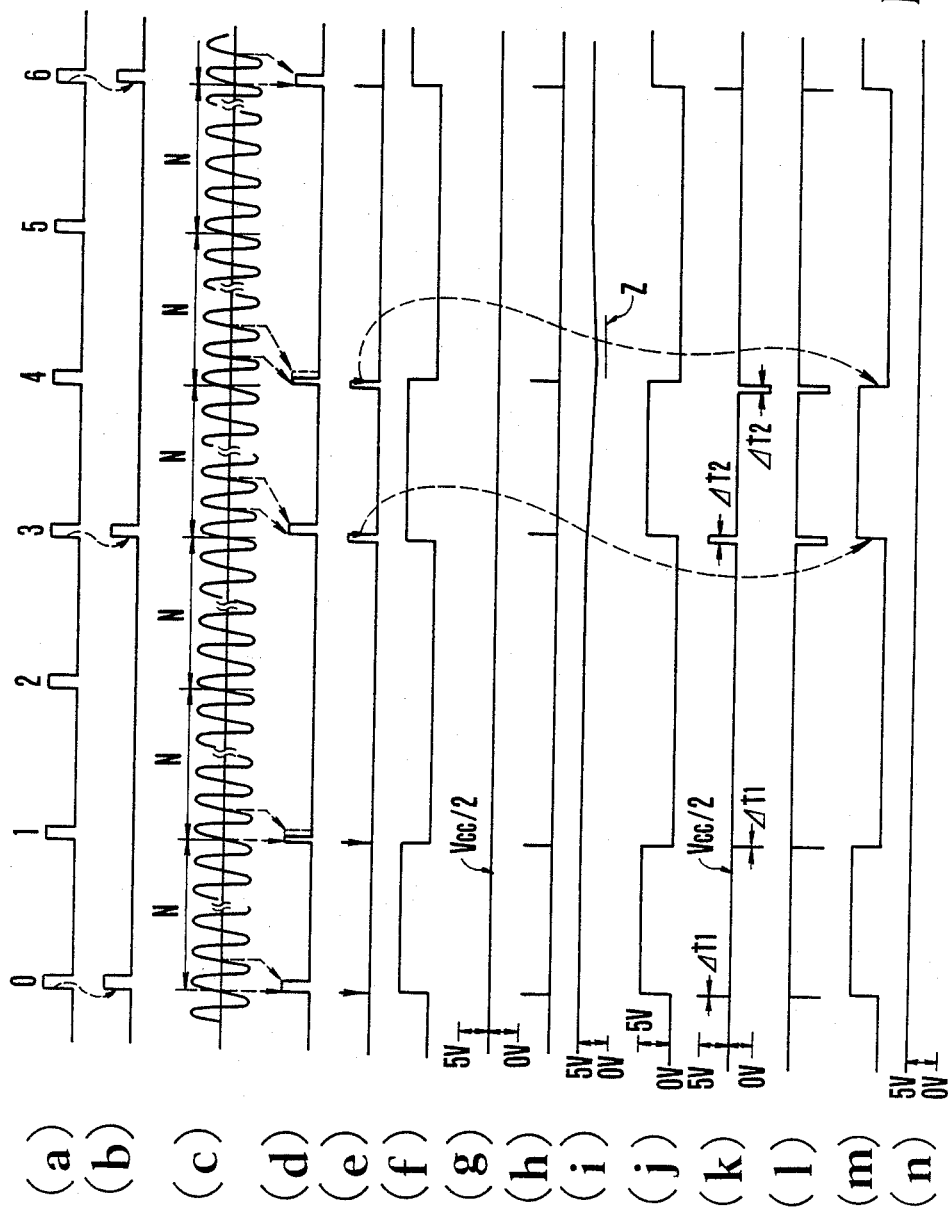
FIG. 6 is a timing chart for explaining the operation of the circuit shown in FIG. 3.
Figure 7:
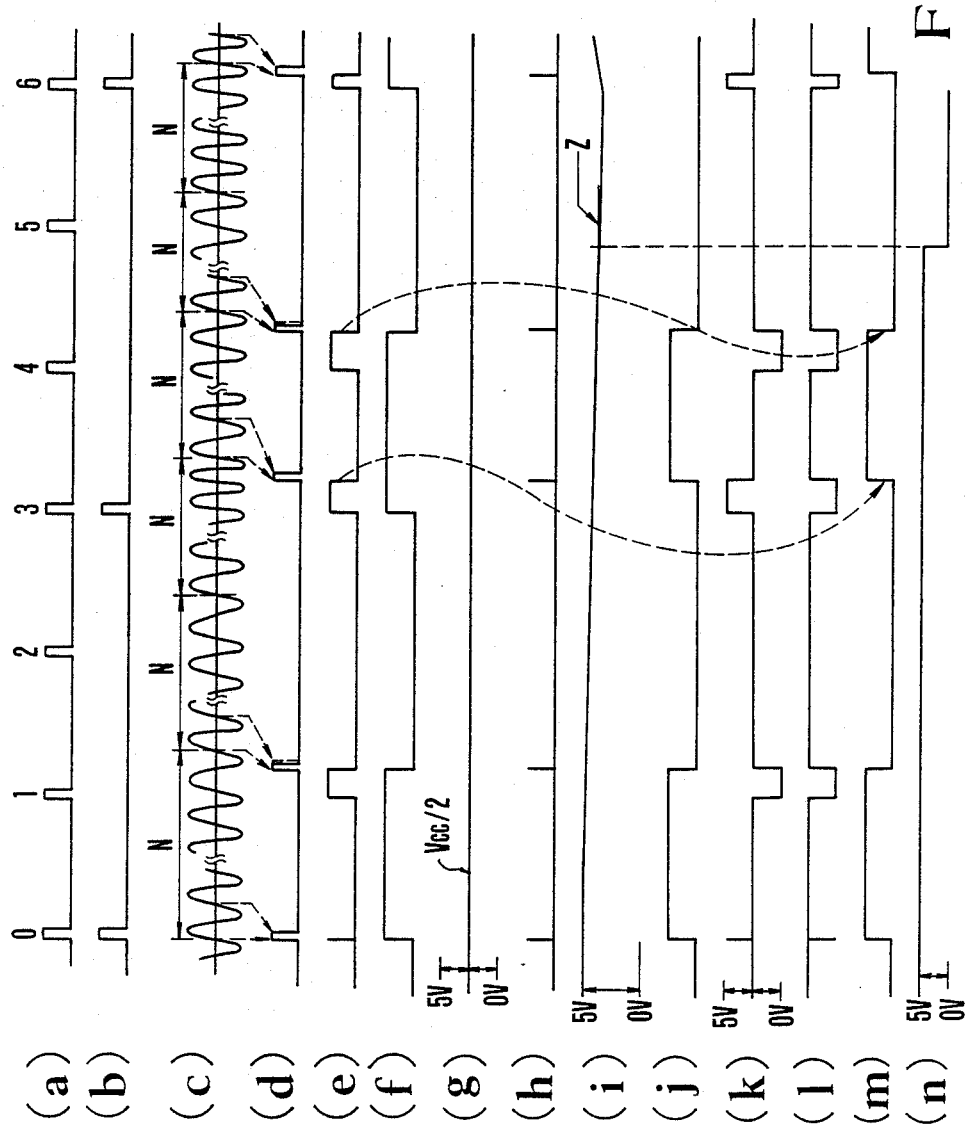
FIG. 7 is a timing chart for explaining the operation of the circuit shown in FIG. 3.

The operation of the circuit shown in FIGS. 3 and 4 will now be described with reference to the timing charts shown in FIGS. 5, 6, and 7. (a) to (n) in FIGS. 5 to 7 represent the waveforms of the signals designated by the same symbols in FIG. 3.

(1) Asynchronous State

Figure 5:
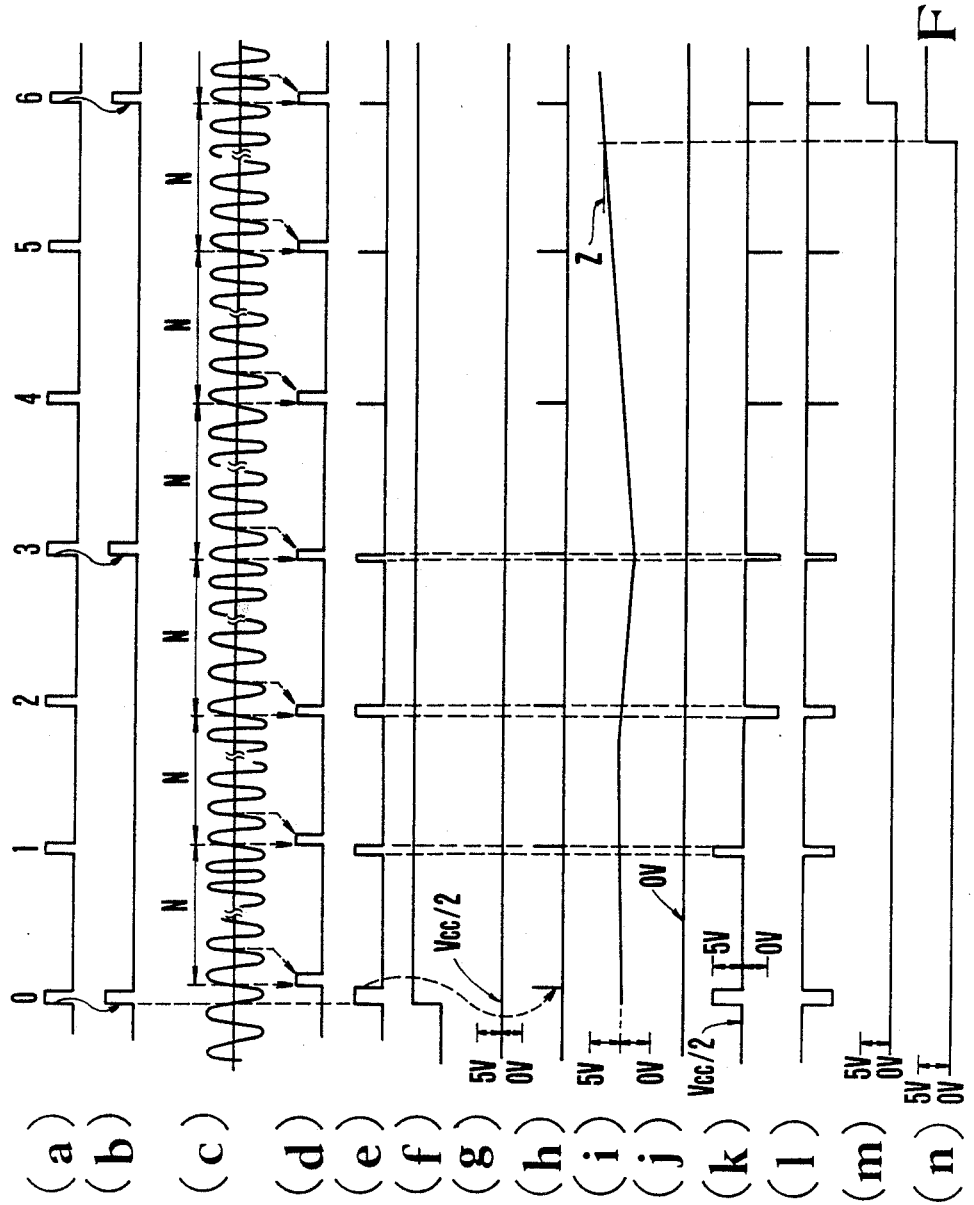
FIG. 5 is a timing chart for explaining the operation of the circuit shown in FIG. 3.

FIG. 5 is a timing chart of the respective signals when the synthesizer apparatus is in the asynchronous state. "N" in FIG. 5(c) indicates the number of carriers when the frequency dividing constant of the frequency divider 8 is 5.

In the asynchronous state, with the above arrangement of the phase comparator 30, the output l goes to "L" only during a phase difference time between the reference input signal a from the frequency divider 2 and the output signal d from the frequency divider 8. The output i, obtained by integrating the output signal l by the resistor 42a and the capacitor 43a, is lower than the synchronous range setting voltage Z shown in FIG. 5(i). For this reason, the output n from the comparator 34 goes to "L", and the output from the AND gate 41 goes to "L". Therefore, the output a from the frequency divider 2 is not supplied to the counter 36, and the FF 38 which is reset in response to the trailing edge of the output m from the counter 36 is not reset. The counter 37 is enabled in response to the first triggering of the output a from the frequency divider 2, and its output goes to "H'" thereby setting the FF 38. Thus, the output f from the power source 39 is turned on, and hence, the frequency divider 8 is continuously powered. The input j of the phase comparator 30 is set at "L" since the input n of the AND gate 40 is at "L". Therefore, the phase comparator 30 is operated in a continuous operation mode. More specifically, as shown in FIG. 4, since the switching operation of the inputs a and d by means of the AND gates 30a, 30b, 30c, and 30d, and the inverter 30m is not enabled, the pulse k having a pulse width proportional to the phase difference between the inputs a and d is output from the output terminal 30E. In this case, since the phase comparator 30 is operated to phase synchronize the VCO 5, the pulse width of the output l is decreased as the apparatus comes closer to the synchronous state. Then, the integrated output i as the average output of the output l exceeds the synchronous range setting voltage Z, and the output n from the comparator 34 goes to "H" in response to the phase synchronization, thereby completing synchronization.

(2) Synchronous State

FIG. 6 is a timing chart of the respective signal waveforms when the synchronization is completed. Since the output n from the comparator 34 goes to "H", the input inhibition of the counter 36 is canceled. At this time, since the input j of the phase comparator 30 is at "L" with respect to the first pulse of the input signal a, the phase comparator 30 outputs the phase difference between the inputs a and d. As shown in FIG. 6(k), if the leading edge of the input a advances ahead of the leading edge of the input d, the phase comparator 30 outputs a pulse which is kept at "H" during a time corresponding to the phase difference. If the inputs a and d have phases opposite to the above, the phase comparator 30 outputs a pulse which is kept at "L" during the phase difference time. Otherwise, the phase comparator 30 outputs a Vcc/2 level output. Since the signal j is enabled in response to the leading edge of the signal e, i.e., the trailing edge of the output k, the signal j is set at "H" level immediately after the phase comparator 30 positively outputs the phase difference output of the first input a with respect to the input d. Therefore, the phase comparator 30 is set in a state for outputting an opposite polarity output. As a result, for the next input d, the phase comparator 30 outputs a signal k which represents the opposite phase relationship of the inputs a and d to that described above.

The output f from the power source 39 is turned on in response to the first pulse of the input a, and is turned off immediately after the phase difference of the next pulse is detected. The count start timing of the frequency divider 8 often differs by one clock of the input c due to variations in rise time of the power source. More specifically, as shown in FIG. 6(k), the state of $\Delta t1 \neq \Delta t2$ occurs during the intermittent operation. However, with the arrangement shown in FIGS. 3 and 4, the output k of the phase comparator 30 is positively changed for the first pulse input, and is negatively changed for the next pulse input. In this manner, phase information of the synchronous state can be accurately detected irrespective of change in $\Delta t1$ and $\Delta t2$, and the phase synchronization state of the circuit can be maintained.

In this manner, in the intermittent operation state, since the power source for the frequency divider 8 is intermittently turned on or off, low power consumption can be attained.

(3) Transition from Synchronous State to Asynchronous State

FIG. 7 is a timing chart showing a transition state from the phase synchronous state to the asynchronous state. If the frequency of the VCO 5 varies for any reason, the phase error signal of the output k of the phase comparator 30 gradually increases, and the average value of the output l synchronous therewith decreases. Therefore, the output n from the comparator 34 goes to "L", and the asynchronous state can be detected. The power source 39 is kept on, and then, the continuous operation is established.

According to the present invention as described above, an average value corresponding to a rise time difference of output signals during an operation period of a frequency divider for frequency-dividing the output signal of the VCO is output from a phase comparator, and the oscillation frequency of the VCO is controlled by this average output. Even when the frequency divider is intermittently operated, stable synchronization can be attained, and the power consumption can be saved.

What is claimed is:

1. A synthesizer apparatus comprising:
   means for generating a reference signal;
   voltage controlled oscillator means whose oscillation frequency is controlled by a control signal;
   frequency divider means, which is intermittently operated, for frequency-dividing the output signal from said voltage controlled oscillator means;
   phase comparator means for comparing phases of the reference signal and the output signal from said frequency divider means, and supplying the control signal to said voltage controlled oscillator means in accordance with the phase difference, wherein said phase comparator means outputs an average value signal having an average value corresponding to a difference in pulse rise times of the output signal from said frequency divider means during an operation period of said frequency divider means; and
   means for setting a synchronous range in accordance with the relationship between the average value signal and a predetermined threshold voltage and setting said frequency divider means in an intermittent operation state during the synchronous range.

2. An apparatus according to claim 1, wherein said phase comparator means comprises a logic circuit group which represents the phase difference between the reference signal and the output signal of said frequency divider means by pulses of opposite polarities at the beginning and end of operation during the intermittent operation of the frequency dividing means, thereby indicating the synchronous state.

3. An apparatus according to claim 2, wherein the amplitude of the pulses of the opposite polarities varies between Vcc and zero volts, and otherwise is Vcc/2, where Vcc is a power source voltage.

* * * * *